United States Patent [19]
Hallowell et al.

[11] Patent Number: 4,899,207
[45] Date of Patent: Feb. 6, 1990

[54] OUTER LEAD TAPE AUTOMATED BONDING

[75] Inventors: David L. Hallowell, Westford; John W. Sofia, Wakefield, both of Mass.

[73] Assignee: Digital Equipment Corporation, Maynard, Mass.

[21] Appl. No.: 219,858

[22] Filed: Jul. 14, 1988

Related U.S. Application Data

[63] Continuation of Ser. No. 900,789, Aug. 27, 1986, abandoned.

[51] Int. Cl.$^4$ ............ H01L 23/48; H01L 23/10; H01L 23/12
[52] U.S. Cl. ............................ 357/70; 357/68; 357/80
[58] Field of Search ............ 357/70, 80, 68, 72; 174/52 FP

[56] References Cited

U.S. PATENT DOCUMENTS

| | | | |
|---|---|---|---|
| 3,657,805 | 4/1972 | Johnson | 357/70 |
| 4,466,183 | 8/1984 | Burns | |
| 4,672,418 | 6/1987 | Moran et al. | 357/70 |

FOREIGN PATENT DOCUMENTS

| | | |
|---|---|---|
| 0016522 | 6/1980 | European Pat. Off. |
| 0147807 | 12/1984 | European Pat. Off. |
| 0233029 | 1/1987 | European Pat. Off. |
| 3219055 | 11/1983 | Fed. Rep. of Germany |
| 60-25263A | 6/1985 | Japan |
| 60-1657488 | 8/1985 | Japan ................. 357/70 |
| 61-24261 | 2/1986 | Japan ................. 357/70 |

OTHER PUBLICATIONS

"Outer Lead Guard for Tab",—IBM Technical Disclosure Bulletin, vol. 28, No. 5, Oct. 1985, pp. 2257-2238.

Primary Examiner—Joseph E. Clawson, Jr.
Assistant Examiner—S. V. Clark
Attorney, Agent, or Firm—Nutter, McClennen & Fish

[57] ABSTRACT

A novel tape-and-semiconductor chip sub-assembly (10) electrically connects bonding pads (not shown) of a semiconductor chip (13) to corresponding leads (26) on a package substrate (12). This tape-and-semiconductor chip sub-assembly includes a thin electrically insulating film, called an inner support ring (18), that has a central aperture (36) for receiving a semiconductor chip (13). The sub-assembly also includes a plurality of conductive fingers (16) on the underside of the film that extend radially inwards beyond the inner ring's inner perimeter for connection to the chip. The fingers also extend radially outward beyond the inner ring's outer perimeter. A novel outer support ring (22) secures the end of each conductive finger in its proper relative position with respect to the other conductive fingers. The outer ring thus facilitates simultaneous alignment during package assembly of all the conductive fingers with the associated substrate leads to which they are respectively to be bonded. It also prevents any of the conductive fingers from curling or sliding during assembly.

16 Claims, 2 Drawing Sheets

OUTER LEAD TAPE AUTOMATED BONDING

This application is a continuation of application Ser. No. 06/900,789, filed Aug. 27, 1986, abandoned 9/14/88.

BACKGROUND OF THE INVENTION

One step in the process of manufacturing an integrated circuit component is packaging. In packaging, a fabricated semiconductor chip is housed in a protective package. The assembled component can be tested and connected to the electronic circuit for which it was designed. The package is provided with external leads so the component can be electrically connected to the electronic circuit.

A difficult part of the packaging process is connecting the chip to the package's external leads. Care must be taken to insure that each bond or connection point on the chip is properly connected to the appropriate external lead. Failure to make all of the proper connections will result in a malfunctioning or nonfunctioning component.

A current method of connecting the chip to the package leads is Tape Automated Bonding (TAB). TAB employs a nonconductive and electrically insulating film tape, usually made of polyimide, having a plurality of individual tape sites. Each site comprises a support ring of film defining a center aperture. A plurality of conductive fingers formed by etching techniques, underly the support ring. Each conductive finger has an inner lead that extends into the center aperture and an outer lead that extends beyond the outer perimeter of the support ring. A chip is positioned over the aperture so that each bond point on the chip is in registration with the appropriate inner lead. The bond points are then bonded to the inner leads.

The tape-and-chip lead sub-assembly is then excised from the tape. The sub-assembly is positioned on a package substrate so that the outer leads are aligned over appropriate package substrate leads which connect to package external leads of the package. Bonding of the outer leads to the substrate leads then connects the chip to the appropriate package external leads.

More thorough discussions of the Tape Automated Bonding process are set forth in Sze, edit., *VLSI Technology*, (1983) pp. 559–564, and in Dais, Erich, and Jaffe, "Face-Down TAB for Hybrids," *IEEE Transactions on Components, Hybirds and Manufacturing Technology* (Dec. 1980) pp. 623–633, which are incorporated herein by reference.

Tape Automated Bonding is an efficient way to connect semiconductor chips to packages. The tape sites can be arranged on the tape to allow for automatic bonding of chips to the tape. By proper etching of the tape, the conductive fingers for each chip can be densely packed at the tape site. This feature is very important in the fabrication of Very Large Scale Integation (VLSI) chips, where often there are 100 to over 300 bonding points per chip.

However, it has proved difficult to align and bond the densely packed tape outer leads to the package substrate leads. There are three reasons for this; (1) curling forces in the leads are different along the tape in-line and across-the-line axes; (2) curling of the metal conductive fingers and the film on which they are etched is different and causes the leads of the sub-assembly to curl; and finally, (3) there is x-y sliding of the individual outer leads when a thermode bonding blade is pushed down on them. This curling and sliding make it difficult to keep the outer leads aligned prior to substrate bonding.

Outer lead curling and sliding also make it difficult to inspect the tape-and-chip sub-assembly prior to lead bonding. To prevent the outer leads from curling out of alignment, it is necessary to promptly bond the outer leads to the substrate leads. Any errors, such as fine misalignment, must be corrected by later inspection and rebonding.

These problems are relatively easy to correct and control when there are 10–100 outer leads per sub-assembly, and there is a lead pitch of more than 0.012 inch. However, VLSI sub-assemblies have 100 or more leads per sub-assembly. The outer leads are densely packed together, i.e., have a finer pitch between leads. As a result, it is very difficult to align and bond the tape outer leads of a VLSI TAB sub-assembly to package substrate leads. This has been a major obstacle to the efficient manufacture of VLSI components.

DETAILED DESCRIPTION OF THE PREFERRED EMBODIMENTS

Figure 1:
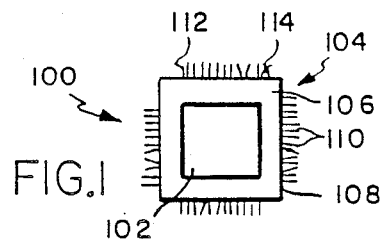
FIG. 1 is a plan view of a tape-and-chip sub-assembly according to the prior art.

FIG. 1 illustrates a prior art tape-and-chip sub-assembly 100. A chip 102 is bonded to a tape section 104. The tape section comprises a single support ring 106 that has a number of conductive fingers 108 etched on its underside. Each conductive finger has an outer lead 110 that extends beyond the outer perimeter of the support ring and inner leads (not shown) that underlie and are bonded to the chip 102. The outer leads are not restrained, and in handling, the individual leads may curl or become crossed as at 112 and 114, respectively. As a result, it is necessary to promptly bond the leads to a substrate without first inspecting and correcting for open, short, or misaligned leads. Furthermore, there is nothing to prevent individual outer leads from sliding out of position when a bonding tool is applied to connect the outer leads to the substrate leads.

Figure 2:
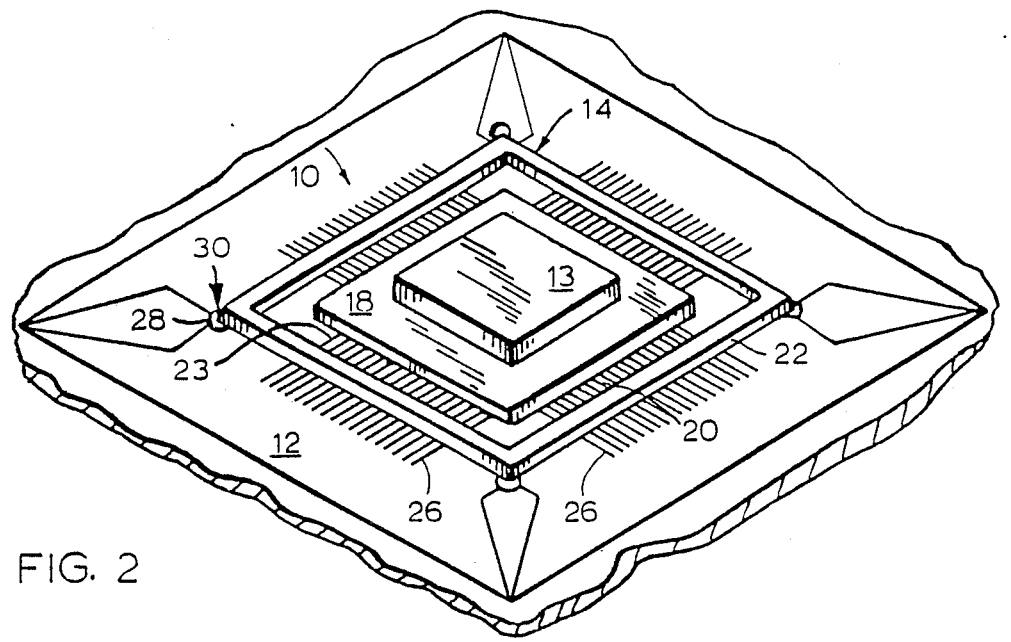
FIG. 2 is an isometric view of a tape-and-chip sub-assembly aligned on a package substrate according to the preferred embodiment of this invention.

FIG. 2 illustrates a tape-and-chip sub-assembly 10 bonded to a package substrate 12 according to this invention. The tape-and-chip sub-assembly 10 comprises a semiconductor chip 13 bonded to an excised section of lead tape 14. A plurality of conductive fingers 16 are etched on the underside of the lead tape 14. There are a sufficent number of fingers to make the necessary extended electrical connections between the chip 13 and the substrate 12. More specifically, the conductive fingers 16 extend out from a square-shaped inner support ring 18 of polyimide film extending around the semiconductor chip 13. Each conductive finger has a distally located outer lead 20. Over the ends of the outer leads 20 is a square-shaped outer support ring 22, also of polyimide film. The inner perimeter of the outer support ring 22 is spaced away from the outer perimeter of the inner support ring 18 to expose portions 23 of the outer leads 20 therebetween.

The tape-and-chip sub-assembly 10 is located on a substrate mounting pad 24. Embedded on the substrate mounting pad 24 are substrate leads 26 that are connected to package external leads, (not shown). The tape-and-chip sub-assembly 10 is positioned over the substrate 12 so that each outer lead 20 portion over the appropriate substrate lead 26. The tape-and-chip sub-assembly 10 is held to the substrate 12 by deposits of flux 28 at the corners 30 of the outer support ring 22.

Figure 3:
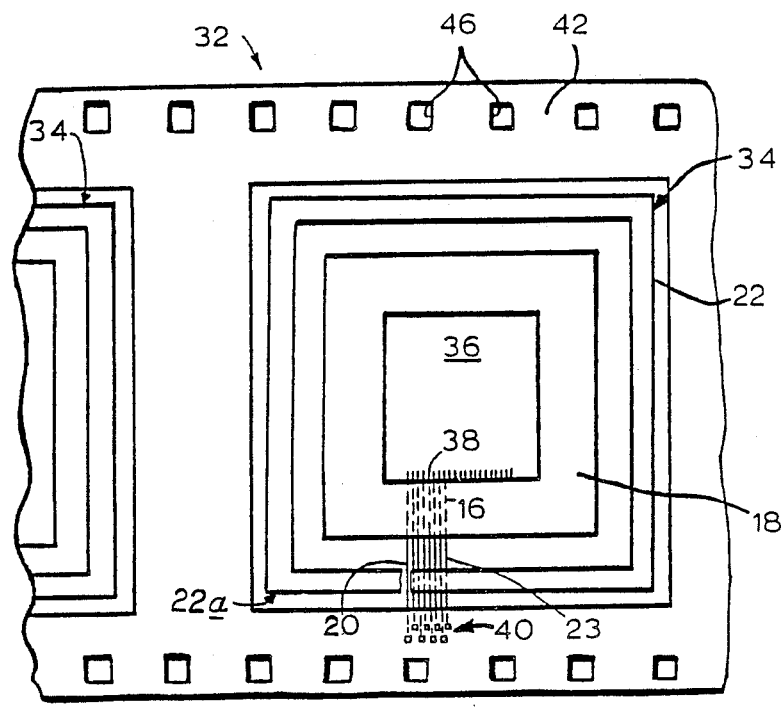
FIG. 3 is a plan view of a section of lead tape according to the preferred embodiment of this invention.

As best seen in FIG. 3, a tape 32 used in this process contains a plurality of individual tape sections 34 arranged serially. The conductive fingers 16 are etched on the undersides of the individual tape sections. The inner support ring 18 and outer support ring 22 are formed by etching so as to expose the portion 23 of outer leads 20 therebetween. A central aperture 36 is etched from the inner support ring 18 to expose an inner lead 38 that extends from each conductive finger 16. Each conductive finger 16 extends beneath the inner support ring 18 and the outer support ring 22, and terminates in a test pad 40 located adjacent to the outer perimeter of the tape section 34. The tape 32 has sides 42 that are provided with sprocket holes 44. The film forming tape 32 may, of course, be of other electrically insulating material than polyimide.

The semiconductor chip 13 is mounted in the central aperture 36 of each tape section 34 according to standard TAB mounting practices. The sprocket holes 46 are provided so the tape 32 can be mechanically advanced through a TAB chip bonding machine (not shown). During chip bonding, the inner leads 38 are connected to the appropriate bond points on the chip 13. The test pads 40 facilitate testing of the tape-and-chip connections after bonding. After inner lead bonding and testing, the tape-and-chip sub-assemblies 10 are excised from the tape 32 along the outer edges of the outer support ring 22.

Figure 5:
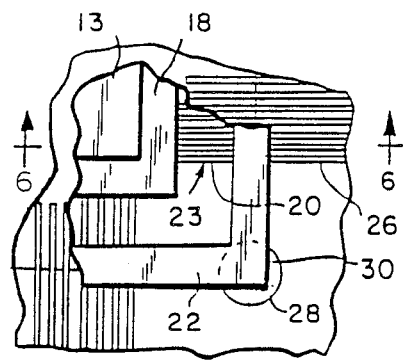
FIG. 5 is an enlarged plan view of a corner portion of the tape-and-chip sub-assembly of FIG. 2.
Figure 6:
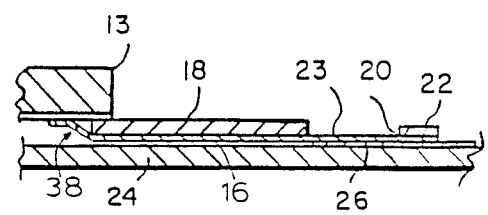
FIG. 6 is a cross-sectional view of the tape-and-chip sub-assembly taken along line 6—6 in FIG. 5.
Figure 4:
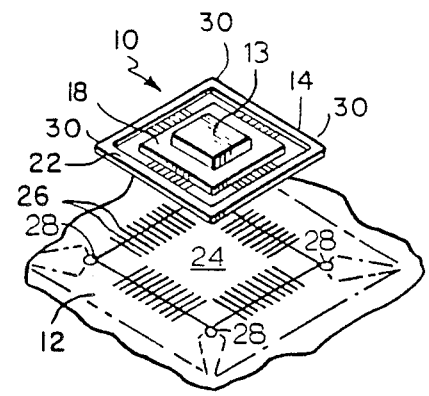
FIG. 4 is an exploded isometric view illustrating the alignment of a tape-and-chip sub-assembly to a package substrate according to the preferred embodiment of this invention.

The first step in bonding the tape-and-chip sub-assembly 10 to the substrate is to apply deposits of flux 28 to the substrate 12, as FIG. 4 illustrates. The flux 28 is applied on the substrate mounting pad 24 at locations where the outer support ring 22 is to be in contact with the substrate 12 and where the outer leads 20 and substrate leads 26 are not to be bonded together. For example, this may be where the outer support ring corner regions 30 are over the substrate mounting pad 24, as FIG. 5 and FIG. 6 illustrate. The preferred type of flux 28 is a rosin-paste flux, from which the solvents, such as butyl carbitol and benzyl alcohol, have been evaporated. This results in a flux 28 that is hard below 100° C. and adhesive and viscous in the range of 120° C.–150° C. The flux 28 is applied to the substrate 12 at a temperature approximately 125° C. An automated "pogo pin/reservoir" system may be used to apply the flux 28 to the substrate 12. The substrate 12 is kept heated to approximately 125° C. to insure that it remains adhesive but does not flow over the substrate.

The tape-and-chip sub-assembly 10 is then placed on the substrate 12. Using TAB assembly techniques the tape-and-chip sub-assembly 10 is positioned so the outer leads 20 are in registration with the appropriate substrate leads 26. After the tape-and-chip sub-assembly 10 is properly aligned, the substrate 12 is cooled to harden the flux 28 and thereby secure the outer ring 22 to the substrate 12 in the proper position. The outer support ring 22, in turn, maintains the individual tape outer leads 20 in position, as FIG. 6 illustrates.

After the tape-and-chip sub-assembly 10 is flux-bonded to the substrate 12, the outer leads 20 can be inspected. Since the outer leads 20 are restrained from moving, the bonded assembly can be thoroughly inspected for openings, shorts, and fine misalignments. Any defects can be repaired by a warm probe. After the assembly has been inspected and, if necessary repaired, the outer leads 20 can then be bonded to the substrate leads 26 using standard micro-bonding techniques. During the outer lead bonding process, the outer support ring 22 prevents the outer leads 20 from sliding when the bonding tool (not shown) is applied. The tape-and-chip sub-assembly 10 is then available for the final steps of the packaging process.

The method of alignment and bonding of this invention is especially suited to the manufacture of VLSI components. The outer support ring 22 can restrain the movement of any number of individual outer leads. Flux bonding the tape-and-chip sub-assembly 10 to the substrate 12 keeps the outer leads 20 aligned during the inspection and lead bonding process. This significantly reduces the amount of effort required to bond the outer leads to a substrate, even though the leads may be densely packed together. These features are important when manufacturing a VLSI component that has a large number of leads in a small space.

What is claimed as new and desired to be secured by Letters Patent of the United States is:

1. A lead tape assembly for electrically connecting a semiconductor chip to a substrate, the lead tape assembly comprising:
    A. a plurality of conductive fingers for electrically connecting bond points on the semiconductor chip to substrate leads on the substrate, each conductive finger having an inner lead for bonding to a semiconductor chip bond point, and an outer lead distally located from the inner lead for bonding to a substrate lead;
    B. an inner support ring over said conductive fingers between said inner leads and said outer leads, said inner support ring forming an aperture for receiving the semiconductor chip, said inner leads extending into said aperture;
    C. an outer support ring over the ends of the outer leads for restricting the movement of the individual outer leads; and
    D. adhesive means on said outer support ring securing said outer support ring to said substrate so that said outer leads are at least temporarily maintained in registration with the substrate leads.

2. The lead tape assembly of claim 1 wherein said outer support ring is spaced away from said inner support ring so as to expose a portion of said outer leads therebetween.

3. The lead tape assembly of claim 2 wherein there is at least one location on said outer support ring free of said outer leads.

4. The lead tape assembly of claim 2 wherein said outer support ring is of a polygon shape having a plurality of corner regions.

5. The lead tape assembly of claim 4 wherein said outer leads are spaced away from the corner regions of said outer support ring.

6. The lead tape assembly of claim 3 wherein said adhesive means is located at said outer support ring free of said outer leads.

7. The lead tape assembly of claim 6 wherein said adhesive means comprises deposits of flux on said outer support ring free of said outer leads, said flux deposits securing said outer support ring to said substrate.

8. The lead tape assembly of claim 5 wherein said adhesive means is located at said corner regions of said outer support ring.

9. The lead tape assembly of claim 8 wherein said adhesive means comprises deposits of flux at said corner regions of said outer support ring, said flux deposits securing said outer support ring to said substrate.

10. A lead tape including at least one tape section for electrically connecting a semiconductor chip to a substrate, said tape section comprising:
A. means forming an outer perimeter in said lead tape;
B. a plurality of conductive fingers for electrically connecting bond points on the semiconductor chip to substrate leads on said substrate, each of said conductive leads having an inner lead for bonding to a semiconductor chip bond points, an outer lead distally located from the inner lead for bonding to a substrate lead, and terminating on the lead tape adjacent to the outer perimeter means;
C. an electrically insulating inner support ring over said conductive fingers between said inner leads and said outer leads, said inner support ring forming an aperture for receiving the semiconductor chip, said inner leads extending into said aperture; and
D. an electrically insulating outer support ring over said outer leads, spaced away from said inner support ring so as to expose a section of said outer leads therebetween, said outer support ring defined by at least one outer edge.

11. The lead tape of claim 10 further comprising at least one of said conductive fingers terminating at a test pad on said lead tape adjacent to the outer perimeter of said tape section.

12. The lead tape of claim 10 wherein there is at least one location on said outer support ring free of said conductive finger outer leads.

13. The lead tape of claim 10 wherein said outer support ring is of polygon shape having a plurality of corner regions.

14. The lead tape of claim 13 wherein said conductive finger outer leads are spaced away from at least one corner region of said outer support ring.

15. The lead tape of claim 10 including a plurality of tape sections arranged serially.

16. A lead tape assembly for electrically connecting a semiconductor chip to a substrate, the lead tape assembly comprising:
A. a plurality of conductive fingers for electrically connecting bond points on the semiconductor chip to substrate leads on the substrate, each conductive finger having an inner lead for bonding to a semiconductor chip bond point, and an outer lead distally located from the inner lead for bonding to a substrate lead;
B. a non-conductive inner support ring over said conductive fingers between said inner leads and said outer leads, said inner support ring forming an aperture for receiving the semiconductor chip, said inner leads extending into said aperture;
C. a non-conductive outer support ring disposed over the ends of said outer leads and spaced away from said inner support ring so as to expose a portion of said outer leads therebetween for restricting the movement of the individual outer leads; and
D. adhesive means on said outer support ring securing said outer support ring to said substrate so that said outer leads are at least temporarily maintained in registration with the substrate leads.

* * * * *

UNITED STATES PATENT AND TRADEMARK OFFICE
CERTIFICATE OF CORRECTION

PATENT NO. : 4,899,207

DATED : February 6, 1990

INVENTOR(S) : David L. Hallowell and John W. Sofia

It is certified that error appears in the above-identified patent and that said Letters Patent is hereby corrected as shown below:

Column 1, after line 6, insert the following omitted Field of the Invention:

--FIELD OF INVENTION

This invention relates to integrated-circuit chip packaging and in particular to the interface between the chip bonding pads and the package leads by which the packaged chip communicates with external circuitry.--

Column 2, after line 20, insert the following omitted Summary of the Invention:

--SUMMARY OF THE INVENTION

The present invention is a semiconductor chip packaging construction that reduces or eliminates the curling and sliding problems associated with the prior-art semiconductor chip packaging. Specifically, a second, outer support ring is disposed concentrically outward from the conventional support ring described above. It secures the outer ends of the conductive fingers that extend beyond the conventional support ring so that these conductive fingers are prevented from curling or sliding with respect to each other. An annular opening between the outer support ring and the conventional support ring exposes the conductive fingers so that they can be bonded therebetween to substrate leads located beneath the conductive fingers.

This second, outer support ring facilitates manufacture of the package. By positioning the outer support ring properly on the substrate surface, one can simultaneously align all the conductive fingers with their associated substrate leads.

UNITED STATES PATENT AND TRADEMARK OFFICE
CERTIFICATE OF CORRECTION

PATENT NO. : 4,899,207

DATED : February 6, 1990

INVENTOR(S) : David L. Hallowell and John W. Sofia

It is certified that error appears in the above-identified patent and that said Letters Patent is hereby corrected as shown below:

By then tacking the corners of the outer support ring to the substrate surface, one can verify each outer lead-substrate lead alignment before actually bonding the outer leads to the substrate leads. With the corners of the outer support ring tacked onto the substrate surface, one can keep each conductive finger in registration with the corresponding substrate lead while the fingers are being bonded to their respective substrate leads. This eliminates the sliding problem associated with the prior-art semiconductor packaging.--

Signed and Sealed this

Nineteenth Day of February, 1991

Attest:

HARRY F. MANBECK, JR.

*Attesting Officer*  *Commissioner of Patents and Trademarks*